United States Patent

[11] 3,585,463

[72] Inventor Paul Richman
Bayside, N.Y.
[21] Appl. No. 778,379
[22] Filed Nov. 25, 1968
[45] Patented June 15, 1971
[73] Assignee General Telephone & Electronics Laboratories, Incorporated

[54] COMPLEMENTARY ENHANCEMENT TYPE MOS TRANSISTORS
6 Claims, 4 Drawing Figs.

[52] U.S. Cl. 317/235R, 317/235 F, 317/235 B; 317/235 AQ, 317/235 G, 317/235 D
[51] Int. Cl. H01l 11/14, H01l 19/00
[50] Field of Search 317/235, 48.4, 48.1, 122.2, 146, 122, 122.11, 121.1

[56] References Cited
UNITED STATES PATENTS

| | | | |
|---|---|---|---|
| 3,461,361 | 9/1969 | Delivoras | 317/235 |
| 3,391,023 | 7/1968 | Frescura | 117/212 |
| 3,449,644 | 6/1969 | Nassibian | 317/235 |
| 3,493,824 | 2/1970 | Richman et al. | 317/235 |

*Primary Examiner*—John W. Huckert
*Assistant Examiner*—Martin H. Edlow
*Attorney*—Robert J. Frank ABSTRACT: Complementary P-channel enhancement-type MOS transistors are provided on the same conductivity type bulk starting material. The N-channel transistors are dielectrically isolated from the P-channel transistors to minimize bulk leakage currents and to permit gold doping of the N-channel units. The gold is diffused into the top surface of the N-chnnel units at a point remote from the channel to the limit of its solid solubility in the starting material and insures that the transistor exhibits a positive threshold voltage.

INVENTOR
PAUL RICHMAN

BY R. J. Frank
ATTORNEY.

COMPLEMENTARY ENHANCEMENT TYPE MOS TRANSISTORS

BACKGROUND OF THE INVENTION

This invention relates to complementary P-channel and N-channel MOS transistors fabricated on the same conductivity type bulk semiconductor material.

The metal-oxide-semiconductor (MOS) transistor is especially suited for use in large scale integrated digital arrays because of its relatively small size and its ability to be switched from a high-impedance "off" state to a low-impedance "on" state. The theory and operation of this type of transistor are described in an article entitled "The Silicon Insulated Gate Field-Effect Transistor" by F. P. Heiman andS. and S. Hofstein appearing in the Sept. 1963 Proceedings of the IEEE. One of the more promising applications of the MOS transistor is the use of MOS transistors in arrays of complementary pairs formed on a single substrate. These complementary arrays utilize both N-channel and P-channel enhancement-type MOS devices incorporated on the same substrate.

While the relative advantages of complementary MOS logic arrays, in particular low standby power dissipation and fast switching speeds are recognized, it has been heretofore difficult to fabricate complementary arrays. In the past, the fabrication of P-channel and N-channel devices has required the provision of moderate resistivity regions of N-type and P-type material within a single substrate. Typically, this is accomplished by forming P-type regions or "beds" in an N-type silicon substrate by low-level diffusion or selective epitaxial refill techniques. The N-channel devices can be fabricated in the P-type regions and the P-channel devices can be fabricated in the remaining N-type areas. Since the electrical characteristics of both types of devices are heavily dependent upon the substrate surface impurity concentration, the processing conditions must be well controlled in order to insure uniformity over the surface of the semiconductor wafer. In practice, it has been difficult to reproducibly to provide uniform counter-doped or refilled N and P regions at these low doping densities in a silicon substrate.

Another approach which has been found to permit both N-channel and P-channel MOS devices to be fabricated on a single substrate utilizes a high resistivity silicon substrate, for example, 10,000 ohm-cm. The substrate is utilized as the common substrate for both N-channel and the P-channel devices and may be either N-type or P-type. High resistivity N-type and P-type materials are referred to herein as $\nu$ and $\pi$ materials respectively. This type of MOS device relies on the rectifying properties of P—$\pi$ or N—$\nu$ interfaces at the drain-substrate and source-substrate boundaries rather than conventional PN junctions. In operation, the reverse leakage currents for the individual N-channel and P-channel devices are essentially negligible when the device is in its "off" or nonconductive state. While this type of MOS structure permits both N-channel and P-channel MOS devices to be fabricated on a single conductivity type substrate and thereby increases the types of circuit available to the designer, the concurrent use of both types of MOS transistor in the complementary inverter configuration has been found to result in the flow of bulk leakage currents in the substrate. These currents can flow between the two complementary devices even through one device may be in an "off" state. The leakage currents are primarily due to the fact that the P-channel unit is biased at a more positive voltage than the N channel unit and the leakage conducting paths through the substrate from the source and drain regions of the P-channel device to the source and drain regions of the N-channel device constitute forward-biased PIN diodes. At the high values of supply voltage in a digital system, these bulk leakage currents can be substantial and eliminate the power savings normally achieved by the complementary configuration.

In addition, the MOS transistors utilized in complementary arrays are normally enhancement-type devices wherein essentially no conduction occurs between the source and drain electrodes when the gate voltage is zero. The enhancement type of N-channel MOS transistor is characterized by a positive threshold voltage required to initiate conduction. The threshold voltage is a function of the amount of charge at the oxide-silicon interface, substrate resistivity, oxide thickness and work-function considerations.

The threshold voltage of an N-channel device is defined herein as the gate voltage that is required to bring the silicon surface to the onset of inversion. Assuming that the surface trapping states are filled, any additional gate voltage attracts conduction band electrons into the channel region to form a conducting path between drain and source. In practice it has been difficult to produce N-channel enhancement devices on high resistivity substrates without employing either a multilayered gate electrode consisting of $SiO_2$ and $A1_2O_3$ or utilizing a gold dopant to achieve a positive shift of the threshold voltage. The use of a multilayer insulator for the N-channel units is undesirable from a manufacturing standpoint since an extra step has to be performed on selective MOS devices. Also, the use of gold has not been favored since it rapidly diffuses throughout the substrate and tends to contaminate or uncontrollably change the characteristics of other parts of the integrated circuit.

In addition, the use of a gold dopant introduced through the channel region of the device has been found to result in surface damage to the silicon substrate. The surface damage adversely affects the properties of the oxide insulating layer and frequently results in gate-to-substrate short circuits.

Accordingly, the present invention is directed to a complementary MOS structure which essentially eliminates leakage currents through the substrate and permits selective gold-doping of the N-channel devices. The MOS transistors are complementary in that both P-channel and N-channel units can be fabricated and interconnected in an integrated circuit.

SUMMARY OF THE INVENTION

Complementary enhancement-type MOS transistors constructed in accordance with the present invention utilize high resistivity semiconductor material as the starting material. The material, typically silicon, can be $\pi$ or $\nu$ type material and is characterized by, in the case of silicon, a resistivity of at least 10,000 ohm-cm. The following brief description refers to complementary pairs formed on a $\pi$ substrate.

The complementary pair contains a P-channel device and an N-channel device formed on a supporting substrate. In addition to the substrate, the N-channel device contains a first high resistivity semiconductive region, in this case $\pi$ material. The first region is dielectrically isolated from the supporting substrate preferably by a layer of silicon dioxide. Second and third high conductivity N-type semiconductive regions are formed in the first region. The regions are donor doped and are referred to herein as the drain and source regions respectively. Drain and source electrodes are normally provided on the corresponding regions.

The high conductivity source and drain regions have a separation therebetween. Means for modulating the surface conductivity between the two regions is provided on the surface of the first region in the separation between the source and drain regions. The modulating means generally includes a first insulating layer formed on the surface of the first region directly over the separation and an overlying gate electrode formed on the insulating layer. A second insulating layer, essentially coplanar with the first layer, is formed on the remaining surface of the first region and adjacent portions of the surface of the integrated circuit.

The second insulating layer contains a plurality of apertures including one at the source region and one at the drain region. In addition, the layer is required to contain at least one aperture overlying the first region and spaced from the source and drain regions and the separation therebetween. This aperture permits the diffusion of gold through the front surface of the integrated circuit at a point remote from the separation. Consequently, the surface of the first region in the separation is not damaged.

An amount of gold is deposited in the appropriate aperture which is sufficient to dope the first region to the limit of the solid solubility of gold therein. Any gold in excess of amount is either evaporated off or remains as a deposit in the aperture. The diffusion is provided by heating the device to a temperature within the approximate range of 900° to 1000° C. When the diffusion takes place, the gold diffuses throughout the first region but, due to the dielectric isolation, is contained therein and does not affect adjacent devices. It has been found that the gold doping through the front surface on the integrated circuit results in the presence of ionized gold acceptor states at the surface of the separation in the first region. These states result in a positive shift in the threshold voltage and provide an N-channel enhancement unit. While this description refers to a $\pi$ material first region, similar results are obtained with $\nu$ material.

The P-channel unit of the complementary pair is formed in a second high resistivity semiconductive region. The second region may be $\pi$ or $\nu$ material and is similar to the first high resistivity region. This second region is dielectrically isolated from the supporting substrate and contains P-type source and drain regions. The source and drain regions are doped to a high conductivity and have a separation therebetween. Means for modulating the surface conductivity of the separation between the P-type source and drain regions is provided on the surface of the second region. This device constitutes the P-channel enhancement MOS transistor of the complementary pair. Due to the dielectric isolation, the P-channel devices are not significantly affected by the selective doping of the N-channel devices. When a plurality of complementary pairs are fabricated in a single substrate, the P-channel devices are dielectrically isolated from the N-channel devices but the individual devices need not be separately isolated from devices of like type.

Further features and advantages of the invention will become more readily apparent from the following detailed description of specific embodiments of the invention when taken in conjunction with the accompanying drawings.

DESCRIPTION OF THE PREFERRED EMBODIMENTS

Figure 1:
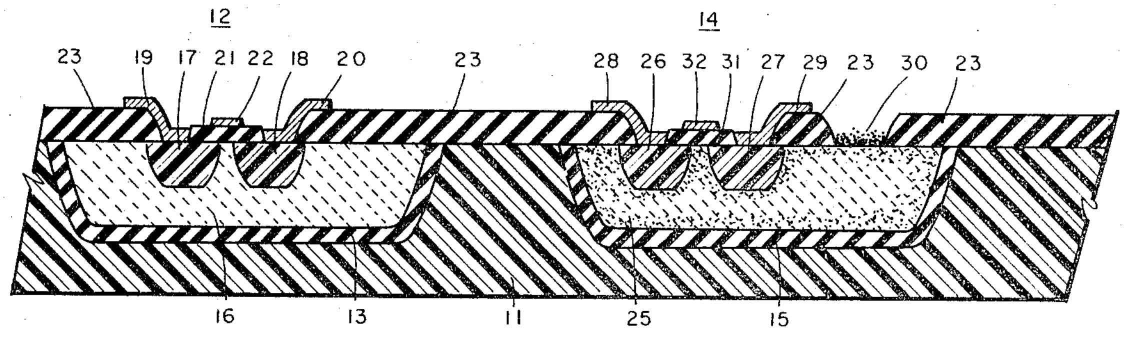
FIG. 1 is a side view in section of one embodiment of the invention.

Referring now to FIG. 1, a complementary pair of MOS transistors is shown fabricated on a supporting substrate 11, typically polycrystalline silicon. The P-channel enhancement device 12 is dielectrically isolated from substrate 11 by silicon dioxide layer. Similarly, N-channel enhancement device 14 is dielectrically isolated from the supporting substrate by oxide layer 15.

The P-channel transistor 12 comprises a high resistivity region 16 containing spaced high conductivity regions 17 and 18 therein. The region 16 is required to have a high resistivity, in excess of 10,000 ohm-cm. in the case of silicon, and may be either $\pi$ or $\nu$ material as previously defined. The regions 17 and 18 are heavily doped with acceptor impurities so as to be highly conductive. For this reason, regions 17 and 18 are designated as P+ material. Region 17, referred to herein as the source region, is provided with an electrode 19. Also, region 18, referred to as the drain region, is provided with electrode 20.

An insulating layer 21, typically silicon dioxide, is formed on the surface of region 16 and overlies the separation between source and drain regions 17, 18. A gate electrode 22 is formed on the portion of insulating layer 21 overlying the separation between regions 17 and 18. An additional insulating layer 23, normally formed of silicon dioxide is formed on the remaining surface of region 16.

In operation, the P-channel transistor is turned on when a negative voltage is applied to gate electrode 22. The negative voltage establishes an electric field in the adjacent portion of insulating layer 21 which results in the attraction of majority carrier holes, in the case of $\pi$ material, from the bulk of region 16 to the interface between the layer and the region. For $\nu$ material, the field attracts minority carrier holes from the bulk of region 16 and establishes an inversion layer proximate to the interface. However in the embodiment of FIG. 1, the majority carrier holes produce a surface accumulation layer which forms a conducting channel between the P+ regions. In normal circuit operation, the source electrode 19 in a P-channel MOS device is coupled to a positive voltage with respect to the drain. Thus, the coupling of source electrode 19 to ground and the application of a negative voltage to the grain electrode 20 results in the flow of current through the induced conducting channel when the voltage applied to gate electrode 22 is negative. The flow of current is enhanced when the gate voltage is increased in magnitude.

The current-voltage operating characteristics for the P-channel transistor 12 of FIG. 1 are shown in FIG. **3*b***. The curves show the enhancement characteristics of the device. The transistor utilizes P+$\pi$ interfaces rather than conventional PN junctions at the drain and substrate region boundaries. As a result, the drain-to-source breakdown voltages of the P-channel device are relatively high, for example, 65 volts before the onset of avalanche breakdown. A detailed description of the properties of the P+$\pi$ interface is contained in the copending U.S. Pat. No. 3,493,824 issued Feb. 3, 1970 in the names of Paul Richman and Walter Zloczower and assigned to the same assignee.

The structure of the complementary N-channel MOS transistor 14 is shown in FIG. 1 formed in the supporting substrate 11. The N-channel device is dielectrically isolated from the substrate 11 by silicon dioxide layer 15. The device includes high resistivity region 25 which is similar to region 16 of P-channel device 12. In practice, high resistivity regions 16 and 25 are formed from a common silicon starting material and dielectrically isolated from each other by preferential etching and oxidation followed by the application of a polycrystalline supporting substrate as a backing layer. The diffusion of the P-type and N-type source and drain regions then takes place. Further description of this technique of providing dielectric isolation is contained in an article in the Mar. 20, 1967 issue of *Electronics* at page 91 et seq.

The N-channel transistor 14 contains spaced N-type high conductivity regions 26 and 27 formed in high resistivity region 25. The regions 26 and 27 are N+ regions indicating that they are of high conductivity and are referred to herein as the drain and source regions respectively. Normally, these regions are formed by the diffusion of phosphorous in the silicon substrate. Insulating layer 31 overlies the separation between the source and drain regions. Electrodes 28, 29 are provided for each of the regions 26, 27 respectively and a gate electrode 32 is formed on the portion of layer 31 overlying the separation.

Insulating layer 23 is shown, extending over the remaining portion of region 25. However, the layer contains aperture 30 overlying region 25 thereby permitting the diffusion of gold in high resistivity region 25 at a point remote from the separation between source and drain regions. The gold is required to provide an N-channel enhancement transistor since the characteristics of the silicon dioxide-silicon interface in the source-drain separation will otherwise result in the formation of an N-type inversion layer. This is apparently due to the presence of positive charge "trapped" in the insulating layer 31. As a result, the N-channel device experiences conduction in the absence of an applied gate voltage and is referred to as a depletion-type device. To provide a complementary pair, the N-channel device is required to be an enhancement-type MOS transistor.

The addition of a gold dopant to the high resistivity region 25 through the front or top surface of the structure is found to result in the creation of a sheet of negative charge in the separation between the source and drain regions. This additional charge, due to the presence of ionized gold acceptor states within the silicon, is found to counteract the fixed positive charge located at the silicon dioxide-silicon interface and permit an N-channel enhancement unit to be fabricated. To insure that this charge compensation is effected, a large amount of gold dopant is diffused into region 25. In practice, the amount of gold diffused into the region is preferably to the limit of the solid solubility of gold in the silicon at the diffusion temperature. The temperature of the gold diffusion is preferably within the approximate range of 900° C. to 1000° C. so that the diffusion does not significantly affect the position of the diffused source and drain regions.

Figure 2:
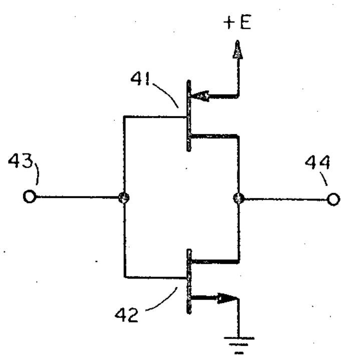
FIG. 2 is an electrical schematic of an inverter circuit utilizing complementary MOS transistors.
Figure 3A:
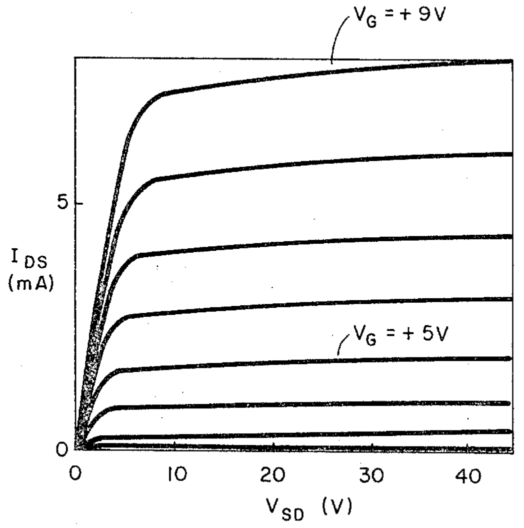
FIGS. 3*a* and 3*b* contain a series of curves showing the operating characteristics of the embodiment of FIG. 1.
Figure 3B:
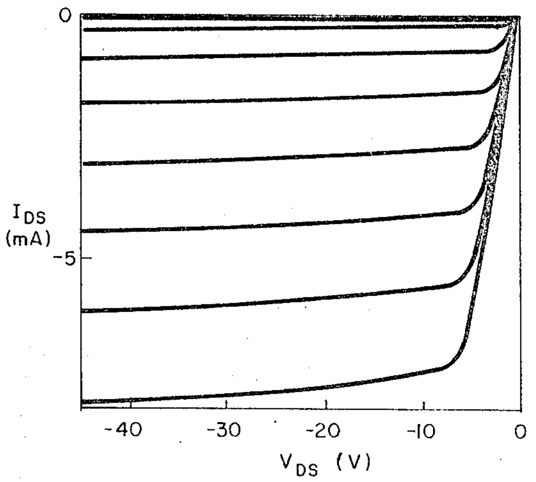

The current-voltage operating characteristics for the N-channel enhancement transistor are shown in FIG. 3*a*. The characteristics show that for increasingly positive gate voltages the current between source and drain, $I_{DS}$, is enhanced rather than diminished. A comparison of the curves of FIG. 3*a* and FIG. 3*b* indicate that the different types of transistors are complementary. The inverter circuit of FIG. 2 shows a pair of complementary MOS transistors coupled between voltage source +E and ground. Transistor 41 is a P-channel device and transistor 42 is an N-channel device. Consequently, one of the pair of transistors is in a nonconductive state regardless of the polarity of the signal applied at input terminal 43. The application of a positive polarity input signal renders transistor 42 conductive and output terminal 44 is therefore at ground potential. Further, the application of a negative or zero input signal renders transistor 41 conductive so that output terminal 44 is at a voltage essentially equal to the supply voltage +E.

In one embodiment containing P-channel and N-channel complementary enhancement-type MOS transistors on a polycrystalline silicon supporting substrate, the resistivity of the single crystal $\pi$ silicon was approximately 40,000 ohm-cm. The source and drain diffusions were about 1 to 2 $\mu$ in depth. The channel was about 2.0 mils in length and about 25 mils in width. The gate insulating layer was about 2000 A. of grown silicon dioxide. Prior to the electrode metallization step, the apertures were cut in the thick oxide insulating layer, typically 8000 A., in the N-channel devices at a distance of about 2 mils from a source or drain region.

The gold was evaporated over the top surface and photoetched to remove all gold not residing in an aperture. The gold was diffused in an argon-oxygen atmosphere at a temperature of about 950° C. Then, the electrode pattern for the gate, source and drain electrodes was formed. The dielectric isolation was provided in a manner which resulted in all P-channel units being insulated from all N-channel units.

While the above description has referred to a specific embodiment of the invention, it will be apparent that many modifications and variations may be made therein without departing from the spirit and scope of the invention.

I claim:

1. A complementary pair of enhancement-type MOS transistors comprising:

a. a substrate;

b. A first high resistivity semiconductor region formed in said substrate;

c. first and second high conductivity P-type semiconductive regions formed in said first high resistivity semiconductor region, said first and second high conductivity P-type regions having a first separation therebetween, said first high resistivity semiconductor region being doped with gold;

d. first dielectric isolation means formed within said substrate, said first dielectric isolation means seperating said first high resistivity semiconductor region from said substrate and confining said gold within said first high resistivity semiconductor region;

e. a second high resistivity semiconductor region formed in said substrate in spaced-apart relationship from said first high resistivity semiconductor region;

f. first and second high conductivity N-type semiconductor regions formed in said second high resistivity semiconductor region, said first and second high conductivity N-type semiconductor regions having a second separation therebetween;

g. electrode means affixed to each of the high conductivity semiconductor regions formed in said first and second high resistivity semiconductor regions;

h. an insulating layer formed on the surface of said substrate, said insulating layer having an aperture therein overlying said first high resistivity semiconductor region in spaced-apart relationship from said second separation and from said N-type semiconductor regions, said gold being diffused into said first high resistivity semiconductor region through said aperture; and i. first and second gate electrodes affixed to said insulating layer adjacent said first and second separations.

2. The complementary pair of MOS transistors in accordance with claim 1, wherein said first high resistivity semiconductor region is gold doped to the limit of the solid solubility of gold therein.

3. The complementary pair of MOS transistors in accordance with claim 1, wherein said first and second high resistivity semiconductor regions have a resistivity at least as large as 10,000 ohm-cm.

4. The complementary pair of MOS transistors in accordance with claim 1, further comprising second dielectric isolation means separating said second high resistivity semiconductor region from said substrate.

5. The complementary pair of MOS transistors in accordance with claim 4 wherein said first and second isolation means are separate layers of silicon dioxide.

6. The complementary pair of MOS transistors in accordance with claim 1, wherein said first and second high resistivity semiconductor regions are formed from the same semiconductor material.